(12) United States Patent
Jindal

(10) Patent No.: US 8,175,213 B2
(45) Date of Patent: May 8, 2012

(54) SYSTEM AND METHOD FOR SETTING COUNTER THRESHOLD VALUE

(75) Inventor: Deepak Jindal, Noida (IN)

(73) Assignee: Freescale Semiconductor, Inc., Austin, TX (US)

( * ) Notice: Subject to any disclaimer, the term of this patent is extended or adjusted under 35 U.S.C. 154(b) by 132 days.

(21) Appl. No.: 12/844,838

(22) Filed: Jul. 28, 2010

(65) Prior Publication Data

US 2012/0027159 A1 Feb. 2, 2012

(51) Int. Cl.
*G01F 15/06* (2006.01)

(52) U.S. Cl. .......................................... 377/19; 377/26

(58) Field of Classification Search ........................ None
See application file for complete search history.

(56) References Cited

U.S. PATENT DOCUMENTS

| | | | |
|---|---|---|---|
| 3,581,066 A | 5/1971 | Maure | |
| 4,028,879 A | 6/1977 | Moegen | |
| 5,327,473 A | 7/1994 | Weigert | |
| 5,483,685 A * | 1/1996 | Okamura | 455/179.1 |
| 5,890,127 A | 3/1999 | Buzsaki | |
| 6,260,162 B1 | 7/2001 | Typaidos | |
| 2004/0221078 A1* | 11/2004 | Samuel et al. | 710/107 |
| 2006/0195747 A1 | 8/2006 | Pramanick | |
| 2008/0062829 A1* | 3/2008 | Yang | 369/47.1 |
| 2009/0039938 A1* | 2/2009 | Kuo et al. | 327/276 |
| 2010/0290580 A1* | 11/2010 | Margolis | 377/26 |

* cited by examiner

*Primary Examiner* — Tuan T Lam
(74) *Attorney, Agent, or Firm* — Charles Bergere

(57) ABSTRACT

A system and method for configuring threshold values for fixed time delay counters of a System on a Chip (SoC) uses a reference clock signal and one or more frequency sub-range control signals corresponding to a frequency sub-range of the reference clock signal. A frequency sub-range of the reference clock signal is determined using the frequency sub-range control signals and the determined frequency sub-range is used to select a counter threshold value. The selected counter threshold value is provided to a counter and the counter then is updated at each cycle of the reference clock signal for a predetermined count based on the counter threshold value.

18 Claims, 2 Drawing Sheets

SYSTEM AND METHOD FOR SETTING COUNTER THRESHOLD VALUE

BACKGROUND OF THE INVENTION

The present invention relates generally to integrated circuits (ICs) and more particularly, to configuring threshold values of counters used in a system on a chip (SoC).

A SoC passes through several stages of production testing before being shipped to a customer. The production testing of the SoC is performed on cycle-accurate automatic test equipment (ATE). The cycle-accurate nature of such testers necessitates transmitting and receiving signals on SoC pads deterministically throughout the chip operation using tester patterns. Failure to meet a predefined timing may lead to undesired yield loss during production runs.

The ATE is programmed to commence various stages of testing of the SoC at predefined times. For example, an ATE that functions based on a clock signal having a predetermined frequency is pre-instructed with a time instant when the desired frequency clock signal will be available for use. The phase locked loops (PLLs) used for generating the desired frequency clock signal require a locking time period to lock the frequency of the clock signal at the desired frequency. Therefore, the ATE has to wait for the locking time period before it can begin using the clock signal to conduct tests on the SoC.

To ensure that the ATE makes the desired frequency clock signal available at identical time instants each time a pattern test cycle is begun, a reset sequence counter is used. The reset sequence counter is configured to provide a wait time before counter expiry. The expiry time period is greater than the PLL locking time period to ensure that subsequent to counter expiry the desired frequency clock signal is available. The expiry of the counter signals availability of the desired frequency clock signal to the ATE, which then initiates a pattern test cycle.

The counters provide a desired wait time by counting a predetermined number of clock cycles of an input clock signal. The input clock signals provided to the counters may have a range of input frequencies, viz. 33 MHz to 167 MHz. The counters are programmed to ensure a minimum wait time irrespective of the input clock signal frequency. For example, for providing a wait time of 100 μs, the counter is configured with a value 0x3FFF, which ensures a wait time of a minimum of 100 μs in a scenario when the highest frequency (167 MHz) input clock signal supported by the counter is used (0x3FFF/167 MHz=100 μs). However, when the lowest frequency clock signal (33 MHz) supported by the counter is used, the wait time becomes approximately 5 times the desired 100 μs wait time (0x3FFF/33 MHz≈500 μs). This results in an undesired delay of 400 μs (500 μs−100 μs=400 μs) in the initiation of the pattern test cycle. The delay introduced in just one pattern translates into a delay of 0.8 s per chip if the chip is tested using 400-500 patterns and each pattern is run at least 4 times (400 μs*500*4=0.8 s). This 0.8 s has an impact on the overall test time of the chip, which in turn has a direct impact on the production cost associated with the chip. Additionally, when the counters are used during a device boot such as for a printer, a mobile phone, etc., this undesirable delay leads to a longer device boot time, which has a direct impact on device performance and customer satisfaction.

Thus, it would be advantageous to be able to set counter values without adding any additional, undesirable delay times that impact device performance.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying figures, in which like references indicate similar elements.

DETAILED DESCRIPTION OF THE PRESENT INVENTION

Figure 1:
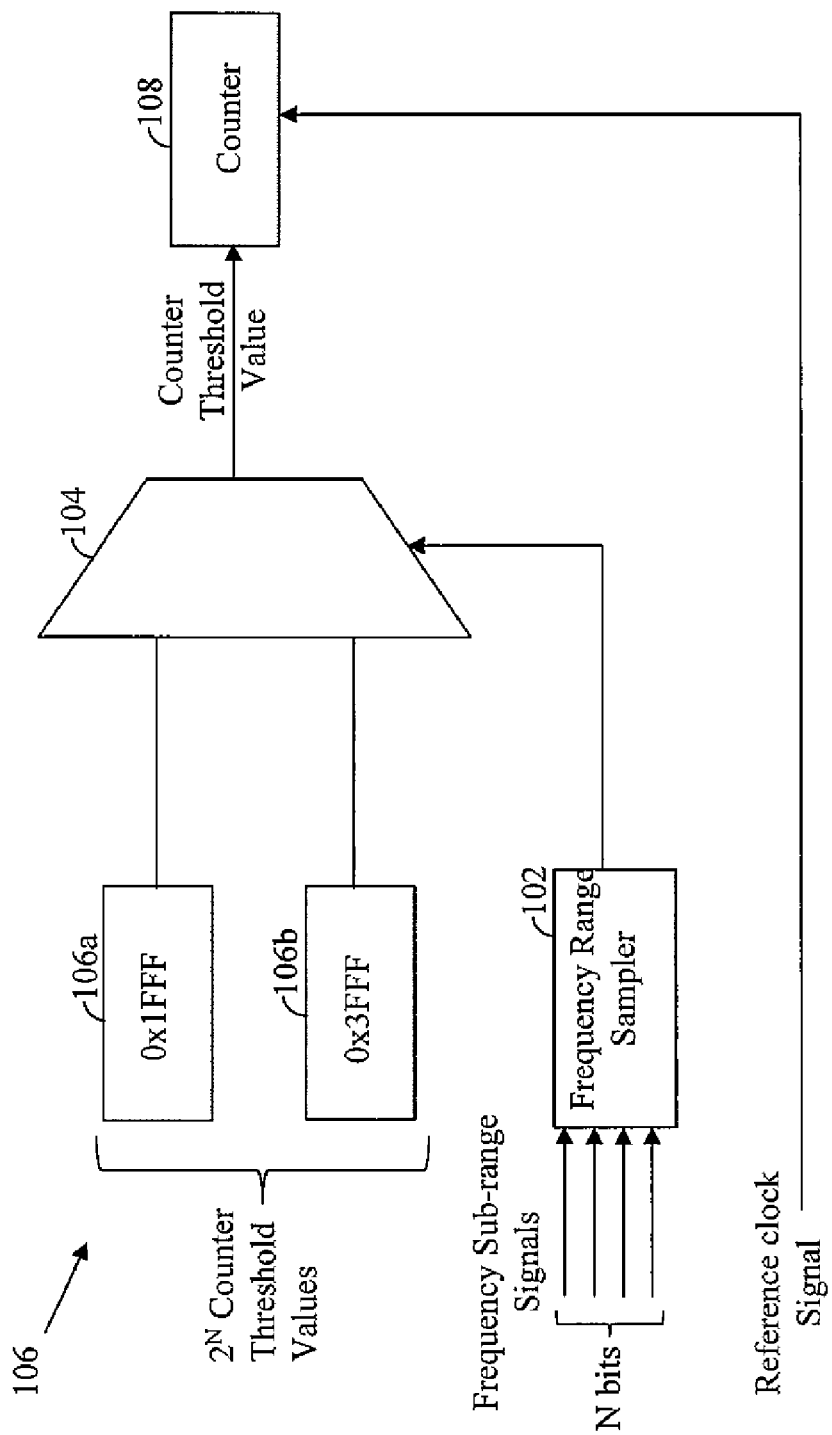
FIG. 1 is a schematic diagram illustrating a system in accordance with an embodiment of the present invention.

The detailed description of the appended drawings is intended as a description of the currently preferred embodiments of the present invention, and is not intended to represent the only form in which the present invention may be practiced. It is to be understood that the same or equivalent functions may be accomplished by different embodiments that are intended to be encompassed within the spirit and scope of the present invention.

In an embodiment of the present invention, a system is provided. The system includes a plurality of memory cells, a multiplexer, which is connected to the plurality of memory cells, and a counter, which is connected to the multiplexer. The memory cells store one or more counter threshold values. A counter threshold value is selected based on the frequency of a reference clock signal. The counter threshold value is received by the counter and the counter is updated at each cycle of the reference clock signal for a predetermined count based on the counter threshold value.

In another embodiment of the present invention, a method of updating counter values is provided. The method includes receiving a reference clock signal and receiving one or more frequency sub-range control signals corresponding to a frequency sub-range of the reference clock signal. Thereafter, the frequency sub-range of the reference clock signal is determined using the one or more frequency sub-range control signals. A counter threshold value is selected from one or more counter threshold values using the frequency sub-range of the reference clock signal. The counter threshold values are stored in one or more memory cells. Subsequently, the counter threshold value is provided to a counter, in which the counter is updated at each cycle of the reference clock signal for a predetermined count based on the counter threshold value.

Various embodiments of the present invention provide a system and a method. A reference clock signal and one or more frequency sub-range control signals corresponding to a frequency sub-range of the reference clock signal are received. Thereafter, the frequency sub-range of the reference clock signal is determined using the one or more frequency sub-range control signals. A counter threshold value is selected from one or more counter threshold values using the frequency sub-range of the reference clock signal. Since the counter threshold value provided to the counter corresponds to the frequency sub-range of the reference clock signal, undesirable wait time introduced by the counter is reduced by selecting a smaller counter threshold value for a lower frequency reference clock signal compared to a counter threshold value selected for a higher frequency reference clock signal. This results in a reduction in the time required for completing SoC processes such as chip testing, chip start-up, chip reset sequence, and power up from standby/deep-sleep mode. Since the test time has a direct impact on the production cost associated with the chip, reducing test time leads to a reduction in the production costs. Further, since, the time required by the chip for becoming ready for operation (start-up time) has a performance impact, reducing the start-up time improves the performance of the chip and of the device using the chip.

Referring now to FIG. 1, a schematic diagram illustrating a system 100 in accordance with an embodiment of the present invention is shown. The system 100 includes a frequency range sampler 102, a multiplexer 104, a memory 106 having memory cells 106a and 106b, and a counter 108.

The counter 108 receive a reference clock signal. In one example, the reference clock signal is an input clock signal provided to a PLL for the generation of a system clock signal. The reference clock signal has a frequency range from 33 MHz to 167 MHz, which is divided into one or more frequency sub-ranges. In an embodiment of the present invention, the frequency range 33 MHz to 167 MHz is divided into two frequency sub-ranges, a first frequency sub-range 33 MHz to 66 MHz and a second frequency sub-range 66 MHz to 167 MHz. In another embodiment of the present invention, the frequency range 33 MHz to 167 MHz may be divided into four frequency sub-ranges, 33 MHz to 40 MHz, 40 MHz to 66 MHz, 66 MHz to 140 MHz, and 140 MHz to 167 MHz.

The frequency range sampler 102 receives one or more frequency sub-range control signals that indicate frequency sub-ranges of the reference clock signal. The frequency sub-range control signals are generated externally from the SoC. In an embodiment of the present invention, the frequency sub-range control signals include N binary bits in which $N=\log_2$ (Number of frequency sub ranges). For example, when the frequency range 33 MHz to 167 MHz is divided into two frequency sub-ranges, viz. 33 MHz to 66 MHz and 66 MHz to 167 MHz, $N=1$ ($\log_2(2)$). Similarly, when the frequency range is divided into four frequency sub-ranges, $N=2$ ($\log_2(4)$). In another embodiment of the present invention, the frequency sub-range control signals include one-hot signals corresponding to the various frequency sub-ranges of the reference clock signal.

The frequency range sampler 102 samples the frequency sub-range control signals to determine the frequency sub-range of the reference clock signal. Thereafter, the frequency range sampler 102 generates a code to indicate to the multiplexer 104 the frequency sub-range to which the frequency of the reference clock signal belongs. In an embodiment of the present invention, the code is a binary code corresponding to the frequency sub-range control signals. In another embodiment of the present invention, the code is an enable signal for selecting a threshold value corresponding to a frequency sub-range.

Thereafter, the code is provided to the multiplexer 104. The multiplexer 104 is connected to the memory cells 106a and 106b. The memory cells 106a and 106b contain counter threshold values corresponding to the various frequency sub-ranges. For example, when the frequency range 33 MHz to 167 MHz is divided into two frequency sub-ranges, viz. 33 MHz to 66 MHz and 66 MHz to 167 MHz, the memory cells 106a and 106b contain the counter threshold values 0x1FFF and 0x3FFF. The counter threshold values are such that a counter threshold value corresponding to a frequency sub-range introduces a desired wait time corresponding to a maximum frequency value of the corresponding frequency sub-range. The calculation of counter threshold values corresponding to a desired wait time and various frequency sub-ranges is explained in detail below.

The multiplexer 104 selects a counter threshold value from the counter threshold values contained in the memory cells 106a and 106b based on the code generated by the frequency range sampler. Thereafter, the selected counter threshold value is provided to the counter 108. The counter 108 is updated at each cycle of the reference clock signal for a predetermined count based on the counter threshold value, in which updating the counter 108 includes either incrementing or decrementing the counter. Subsequent to incrementing/decrementing the counter for the predetermined count, the counter expires. The time duration subsequent to which the counter 108 expires is a wait time provided by the counter 108.

In an example, the desired wait time is locking time of the PLL. In another example, the desired wait time is the wait time required during power ramp-up scenarios. In systems supporting standby or deep-sleep modes, the power supply is shut-off for a portion of the system. The counters are used during wakeup from deep-sleep to ensure sufficient wait time, ranging from 500 us to 3-4 ms, is provided for switchable power supply to ramp-up and become stable for normal operation of the SoC.

In an embodiment of the present invention, the counter 108 is a system on a chip (SoC) reset sequence counter used in SoC reset sequence to provide desired PLL locking time before reset sequence completes to indicate system ready for operation. The SoC pattern testing is performed using at least one of the joint test action group (JTAG) patterns, memory built-in self test (MBIST) patterns, scan patterns, on-die-measurement (ODM) patterns, core expose patterns, Interface Electrical characterization patterns, and module functional patterns.

In accordance with the example illustrated in FIG. 1, the multiplexer 104 selects and provides the counter threshold value 0x1FFF to the counter 108 corresponding to the frequency sub-range 33 MHz to 66 MHz and the counter threshold value 0x3FFF corresponding to the frequency sub-range 66 MHz to 167 MHz. Thus, in a scenario when the frequency of the reference clock signal is 66 MHz, the counter 108 is provided counter threshold value 0x1FFF. This results in a wait time of 122 μs (0x1FFF*time period of 66 MHz clock signal). It should be realized by persons skilled in the art that the counters are configured to provide a wait time, e.g. 122 μs, in excess of an actual desired wait time, e.g. 100 μs, for ensuring safe and consistent operation. Further, in a scenario when the frequency of the reference clock signal is 33 MHz, the counter 108 is provided counter threshold value 0x1FFF since the 33 MHz is in the same frequency sub-range (33-66 MHz) as the 66 MHz reference clock signal. This results in a wait time of 248 μs (0x1FFF*time period of 33 MHz clock signal), which includes an additional wait time of 148 μs (248−100 μs) as compared to the scenario when the highest frequency reference clock signal is used. The additional wait time when the lowest frequency reference clock signal (33 MHz) is used is less than the undesired wait time of 400 μs (500 μs−100 μs) introduced when counter threshold value 0x3FFF is used. The undesired wait time can be further reduced by dividing the reference clock signal frequency range into a greater number of frequency sub-ranges and accordingly selecting a counter threshold value corresponding to a frequency sub-range.

Figure 2:
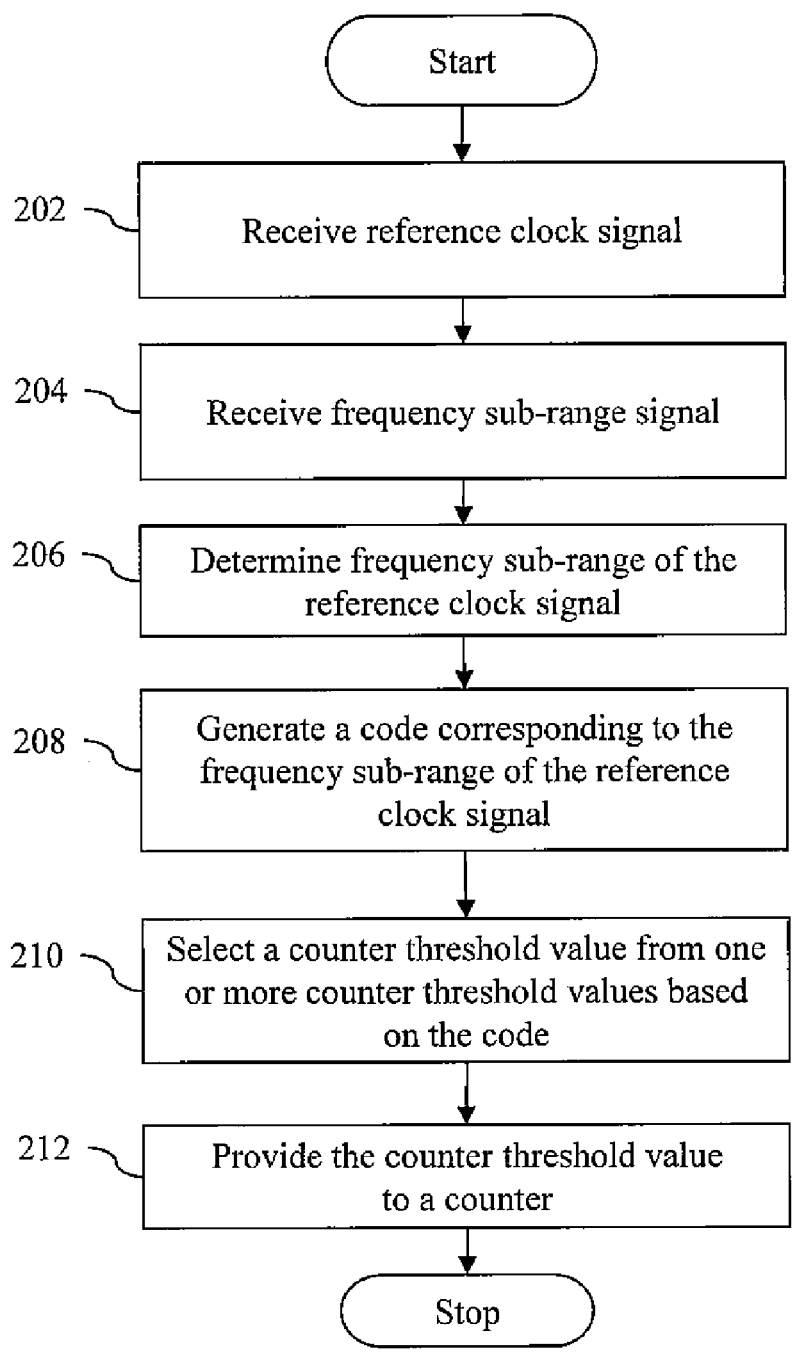
FIG. 2 is a flowchart illustrating a method in accordance with an embodiment of the present invention.

Referring now to FIG. 2, a flowchart 200 illustrating a method in accordance with an embodiment of the present invention is shown.

At step 202, a reference clock signal is received. The reference clock signal is received by a counter. In an example, the reference clock signal is an input clock signal provided to a PLL for the generation of a system clock signal. The reference clock signal has a frequency range from 33 MHz to 167 MHz. Further, the frequency range of the reference clock signal is divided into one or more frequency sub-ranges. In an embodiment of the present invention, the frequency range 33

MHz to 167 MHz may be divided into two frequency sub-ranges, a first frequency sub-range 33 MHz to 66 MHz and a second frequency sub-range 66 MHz to 167 MHz. In another embodiment of the present invention, the frequency range 33 MHz to 167 MHz may be divided into four frequency sub-ranges, 33 MHz to 40 MHz, 40 MHz to 66 MHz, 66 MHz to 140 MHz, 140 MHz to 167 MHz, and so forth.

At step 204 one or more frequency sub-range control signals are received. The frequency sub-range control signals are received by a frequency range sampler. The frequency sub-range control signals indicate a frequency sub-range of the reference clock signal. In an embodiment of the present invention, the frequency sub-range control signals include N binary bits in which N=$\log_2$ (Number of frequency sub ranges). For example, when the frequency range 33 MHz to 167 MHz is divided into two frequency sub-ranges, viz. 33 MHz to 66 MHz and 66 MHz to 167 MHz, N=1 ($\log_2(2)$) implying that one bit may be used to represent the frequency sub-range of the reference clock signal. In another embodiment of the present invention, the frequency sub-range control signals include one-hot signals corresponding to the various frequency sub-ranges of the reference clock signal.

At step 206 the frequency sub-range of the reference clock signal is determined by sampling the frequency sub-range control signals. In the example mentioned above, a frequency sub-range control signal including one bit is used to represent two frequency sub-ranges. When the frequency sub-range control signal is determined subsequent to sampling to have a value binary 0, the frequency sub-range of the reference clock signal is determined to be 33 MHz to 66 MHz, and when the frequency sub-range control signal is determined subsequent to sampling to have a value binary 1, the frequency sub-range of the reference clock signal is 66 MHz to 167 MHz.

At step 208 a code is generated to indicate the frequency sub-range of the reference clock signal. In an embodiment of the present invention, the code is generated by the frequency range sampler. Thereafter, the frequency range sampler provides the code to a multiplexer. In an embodiment of the present invention, the code is a binary code corresponding to the frequency sub-range control signals. In another embodiment of the present invention, the code is an enable signal for selecting a threshold value corresponding to a frequency sub-range. At step 210, a counter threshold value is selected based on the code generated. Thus, the counter threshold value selected by the multiplexer from one or more counter threshold values is based on the frequency sub-range of the reference clock signal. At step 212, the counter threshold value is provided to the counter. The counter updates at each cycle of the reference clock signal for a predetermined count based on the counter threshold value, in which updating the counter includes either incrementing or decrementing the counter. Subsequent to incrementing/decrementing for the predetermined count, the counter expires. The time duration subsequent to which the counter expires is a desired wait time provided by the counter. In an embodiment of the present invention, a desired wait time is the locking time of a PLL.

The selected counter threshold value when used by the counter reduces the greater than a desired wait time provided by the counter. For example, the multiplexer selects and provides the counter threshold value 0x1FFF to the counter corresponding to the frequency sub-range 33 MHz to 66 MHz and the counter threshold value 0x3FFF corresponding to the frequency sub-range 66 MHz to 167 MHz. Therefore, the counter uses counter threshold value 0x1FFF when 66 MHz reference clock signal is used. This results in a wait time of 122 µs (0x1FFF*time period of 66 MHz clock signal). Further, in a scenario when the frequency of the reference clock signal is 33 MHz, the counter is provided counter threshold value 0x1FFF since the 33 MHz is in the same frequency sub-range (33-66 MHz) as the 66 MHz reference clock signal. This results in a wait time of 248 µs (0x1FFF*time period of 33 MHz clock signal) which includes an undesired wait time of 148 µs (248−100 µs) as compared to the scenario when highest frequency reference clock signal is used. The undesired wait time when the least frequency reference clock signal (33 MHz, 148 µs) is used is less than the undesired wait time of 400 µs (500 µs−100 µs) introduced when counter threshold value 0x3FFF is used. The undesired wait time can be further reduced by dividing the reference clock signal frequency range into a greater number of frequency sub-ranges and accordingly selecting a counter threshold value corresponding to a frequency sub-range.

While various embodiments of the present invention have been illustrated and described, it will be clear that the present invention is not limited to these embodiments only. Numerous modifications, changes, variations, substitutions, and equivalents will be apparent to those skilled in the art, without departing from the spirit and scope of the present invention, as described in the claims.

What is claimed is:

1. A system for setting a counter threshold value, comprising:
   a memory for storing one or more counter threshold values;
   a multiplexer, connected to the memory, for selecting a counter threshold value from the one or more counter threshold values based on the frequency of a reference clock signal; and
   a counter, connected to the multiplexer, that receives the selected counter threshold value from the multiplexer, wherein the counter is updated at each cycle of the reference clock signal for a predetermined count based on the selected counter threshold value.

2. The system for setting a counter threshold value of claim 1, wherein updating the counter comprises incrementing the counter at each cycle of the reference clock signal.

3. The system for setting a counter threshold value of claim 1, wherein updating the counter comprises decrementing the counter at each cycle of the reference clock signal.

4. The system for setting a counter threshold value of claim 1, wherein the counter is a system on a chip (SoC) reset sequence counter.

5. The system of setting a counter threshold value of claim 4, wherein the counter provides a phase locked loop (PLL) locking time for a system on a chip (SoC) reset sequence during SoC testing.

6. The system of setting a counter threshold value of claim 5, wherein the SoC testing uses at least one of joint test action group (JTAG) patterns, memory built-in self test (MBIST) patterns, scan patterns, on die measurement (ODM) patterns, core expose patterns, interface electrical characterization patterns, and functional test patterns.

7. The system for setting a counter threshold value of claim 4, further comprising:
   a frequency range sampler, connected to the multiplexer, for determining a frequency sub-range of the reference clock signal, wherein the frequency range sampler receives one or more frequency sub-range control signals corresponding to a frequency sub-range of the reference clock signal, samples the one or more frequency sub-range control signals to determine the frequency sub-range of the reference clock signal, and generates a code based on the determined frequency sub-range of the reference clock signal.

8. The system for setting a counter threshold value of claim 7, wherein the multiplexer selects the counter threshold value based on the code.

9. A system for setting a threshold value of a reset sequence counter, the system comprising:
- a memory for storing one or more counter threshold values;
- a multiplexer, connected to the memory, for selecting a counter threshold value from the one or more counter threshold values based on the frequency of a reference clock signal;
- a counter, connected to the multiplexer, that receives the selected counter threshold value from the multiplexer, wherein the counter is updated at each cycle of the reference clock signal for a predetermined count based on the selected counter threshold value; and
- a frequency range sampler, connected to the multiplexer, for determining a frequency sub-range of the reference clock signal, wherein the frequency range sampler receives one or more frequency sub-range control signals corresponding to a frequency sub-range of the reference clock signal, samples the one or more frequency sub-range control signals to determine the frequency sub-range of the reference clock signal, and generates a code based on the determined frequency sub-range of the reference clock signal, and wherein the multiplexer selects the counter threshold value based on the code.

10. A method of setting a counter threshold value, comprising:
- receiving a reference clock signal;
- receiving one or more frequency sub-range control signals corresponding to a frequency sub-range of the reference clock signal;
- determining the frequency sub-range of the reference clock signal using the one or more frequency sub-range control signals;
- selecting a counter threshold value from one or more counter threshold values based on the frequency sub-range of the reference clock signal; and
- providing the counter threshold value to a counter, wherein the counter is updated at each cycle of the reference clock signal for a predetermined count based on the counter threshold value.

11. The method of setting a counter threshold value of claim 10, wherein updating the counter comprises incrementing the counter at each cycle of the reference clock signal.

12. The system of setting a counter threshold value of claim 10, wherein updating the counter comprises decrementing the counter at each cycle of the reference clock signal.

13. The system of setting a counter threshold value of claim 10, wherein the one or more counter threshold values are stored in one or more memory cells.

14. The method of setting a counter threshold value of claim 10, wherein the counter is a SoC reset sequence counter that provides a phase locked loop (PLL) locking time for a system on a chip (SoC) reset sequence during SoC testing.

15. The system of setting a counter threshold value of claim 14, wherein the SoC testing uses at least one of joint test action group (JTAG) patterns, memory built-in self test (MBIST) patterns, scan patterns, on die measurement (ODM) patterns, interface electrical characterization patterns, functional test patterns, and core expose patterns.

16. The method of setting a counter threshold value of claim 10, wherein determining the frequency sub-range of the reference clock signal comprises sampling the one or more frequency sub-range control signals.

17. The method of setting a counter threshold value of claim 16, further comprising generating a code corresponding to the determined frequency sub-range of the reference clock signal.

18. The method of setting a counter threshold value of claim 17, wherein selecting a counter threshold value comprises selecting the counter threshold value based on the code.

* * * * *